United States Patent
Salvi et al.

(10) Patent No.: US 9,654,159 B2
(45) Date of Patent: May 16, 2017

(54) SYSTEMS FOR AND METHODS OF USING A MIRRORED WIDEBAND BASEBAND CURRENT FOR AUTOMATIC GAIN CONTROL OF AN RF RECEIVER

(71) Applicant: MOTOROLA SOLUTIONS, INC, Schaumburg, IL (US)

(72) Inventors: Raul Salvi, Boca Raton, FL (US); Joseph P Heck, Ft Lauderdale, FL (US); Geetha B Nagaraj, Coral Springs, FL (US); Shafiullah Syed, Parkland, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 295 days.

(21) Appl. No.: 14/137,042

(22) Filed: Dec. 20, 2013

(65) Prior Publication Data

US 2015/0180516 A1 Jun. 25, 2015

(51) Int. Cl.
*H04B 1/12* (2006.01)
*H04B 1/00* (2006.01)
*H03G 3/30* (2006.01)

(52) U.S. Cl.
CPC .......... *H04B 1/123* (2013.01); *H03G 3/3052* (2013.01); *H04B 1/0067* (2013.01)

(58) Field of Classification Search
CPC combination set(s) only.
See application file for complete search history.

(56) References Cited

U.S. PATENT DOCUMENTS

| | | | |
|---|---|---|---|
| 5,204,973 A | 4/1993 | Sugayama | |
| 6,812,686 B2 | 11/2004 | Chaoui | |
| 6,934,520 B2 | 8/2005 | Rozsypal | |
| 7,373,125 B2 | 5/2008 | Godambie et al. | |

(Continued)

FOREIGN PATENT DOCUMENTS

| | | |
|---|---|---|
| GB | 2381415 A | 4/2003 |
| GB | 2431548 A | 4/2007 |
| WO | 2007/008314 A2 | 1/2007 |

OTHER PUBLICATIONS

J. Laskar, et al., "Reconfigurable RFIC's and Modules for Cognitive Radio", IEEE, SiRF 2006, pp. 283-286.

*Primary Examiner* — Junpeng Chen
(74) *Attorney, Agent, or Firm* — Barbara R. Doutre; Tech Law LLP

(57) ABSTRACT

Disclosed herein are systems for and methods of using a mirrored wideband baseband current for automatic gain control of an RF receiver. In an embodiment, a system includes an RF receiver having an adjustable gain and being configured to direct convert a received wideband RF signal to a wideband baseband current signal. The system further includes a current replicator coupled to the receiver and configured to generate a mirrored current of the wideband baseband current signal. The system further includes a wideband signal-level detector configured to receive the mirrored current from the current replicator, and to measure and output a signal-level value of the mirrored current. The system further includes an automatic gain-control circuit configured to receive the signal-level value from the wideband signal-level detector, and to adjust the gain of the receiver based at least in part on the received signal-level value.

18 Claims, 12 Drawing Sheets

(56) References Cited

U.S. PATENT DOCUMENTS

| | | |
|---|---|---|
| 7,459,970 B2 | 12/2008 | Yang |
| 7,680,476 B2 | 3/2010 | Trankle |
| 8,224,280 B2 | 7/2012 | Ben-Ayun et al. |
| 8,301,208 B2 | 10/2012 | Katsube et al. |
| 2005/0009489 A1* | 1/2005 | Sekiguchi ............... H03D 3/008 455/232.1 |
| 2007/0197178 A1 | 8/2007 | Gu |
| 2012/0274302 A1 | 11/2012 | Vora |
| 2012/0319774 A1* | 12/2012 | Ibrahim ............... H03G 3/3068 330/129 |
| 2013/0028357 A1* | 1/2013 | Haub ................... H04B 1/1027 375/350 |
| 2013/0044842 A1 | 2/2013 | Wang et al. |
| 2013/0084821 A1 | 4/2013 | Kapoor et al. |
| 2013/0156137 A1* | 6/2013 | Higuchi ................. H04B 1/16 375/340 |

* cited by examiner

SYSTEMS FOR AND METHODS OF USING A MIRRORED WIDEBAND BASEBAND CURRENT FOR AUTOMATIC GAIN CONTROL OF AN RF RECEIVER

BACKGROUND OF THE INVENTION

In general, signal processing refers to techniques and processes by which analog and digital signals are created, transmitted, received, and interpreted, among other functions. In many instances, the signals are electromagnetic signals that are processed using various electrical devices and circuits, some of which are known as receivers. When the signals that are being received are radio-frequency (RF) signals, the receivers are known as RF receivers, which often have an antenna structure connected to what is known as the front end of the receiver, the front end in turn being connected to a demodulation stage.

Two types of RF receivers are those known as voltage-mode RF receivers and current-mode RF receivers. More generally, various circuit components (i.e., elements) can be realized as either voltage-mode components or as current-mode components. In voltage-mode receivers and components, the information of a given signal is represented in the voltage domain (as a set of nodal voltages of a given circuit). In current-mode receivers and components, the information of a given signal is represented in the current domain (as a set of branch currents of a given circuit).

Furthermore, electromagnetic signals have various characteristic properties, one of which is frequency, which is typically expressed in Hertz (Hz) or a standard multiple thereof such as kilohertz (kHz), megahertz (MHz), gigahertz (GHz), and the like. Signals are often categorized by frequency into defined ranges, two common examples being RF signals and baseband signals. RF signals are typically defined as signals having frequencies in a range of a few MHz to about 300 GHz, some representative examples that are used in communications being 800 MHz, 1900 MHz, and 2.4 GHz, among many other examples. Baseband signals are typically defined as signals having frequencies ranging from 0 (zero) Hz to the modulation bandwidth of the received signal. Another category, which is often referred to as "intermediate signals," is typically generally defined as signals having frequencies that lie between those of RF signals and those of baseband signals. Moreover, terms such as baseband signals (and baseband frequencies), intermediate signals (and intermediate frequencies), RF signals (and RF frequencies), and the like, are known to those having skill in the art; as such, the above definitions should be taken as being illustrative and not as limiting any such terms to any specific numerical values.

Furthermore, as is also known to those of skill in the art, a signal in a given category (i.e., a signal that has a frequency that falls within the given category) can be converted into a signal in another category (i.e., into a signal that has a frequency that falls within the other category). In the context of a given receiver, the front end typically carries out this process, which is often called frequency translation. Many RF receivers operate such that they convert received RF signals into intermediate signals, and then in turn convert those intermediate signals into baseband signals, which are generally considered to be more feasible and practical to process (e.g., demodulate) than are signals at (the higher) intermediate and RF frequencies. Other RF receivers are arranged to perform what is known as direct conversion, whereby RF signals are converted directly into baseband signals. Such RF receivers are often referred to as direct-conversion RF receivers.

As is further known to those of skill in the art, a given receiver may receive a signal that includes a number of different signals, referred to at times herein as component signals, at a number of different frequencies. The difference between the highest frequency and the lowest frequency among the various frequencies of the component signals is known as the bandwidth of the received signal, indicating how much of the electromagnetic spectrum is spanned by that signal. Signals that have relatively large bandwidths are often referred to as being wideband, while signals that have relatively small bandwidths are often referred to as being narrowband.

In operation, and among other functions, a direct-conversion RF receiver, whether it be a current-mode receiver or a voltage-mode receiver, that is tuned to what is known in the art as a channel of interest typically (i) receives a wideband RF signal that includes the channel of interest and (ii) outputs to its demodulation stage a narrowband baseband voltage signal that contains essentially only the channel of interest. Indeed, that narrowband baseband voltage signal typically has a bandwidth that ranges from a few kHz to the tens of MHz, spanning the channel of interest.

If a potentially interfering signal is present in the RF environment at a frequency outside of that narrow band, the receiver may experience what is known as front-end compression—reducing the likelihood of reliably receiving and decoding the channel of interest—without knowing (i.e., without being able to detect, respond to, correct for, and the like) the cause of such compression. To address this issue as well as others, the present systems and methods use a mirrored wideband baseband current for automatic gain control of an RF receiver.

BRIEF DESCRIPTION OF THE FIGURES

The accompanying figures, where like reference numerals refer to identical or functionally similar elements, together with the detailed description below, are incorporated into and form part of the specification, and serve to further illustrate embodiments of the following claims, and explain various principles and advantages of those embodiments.

Those having skill in the relevant art will appreciate that elements in the figures are illustrated for simplicity and clarity, and have not necessarily been drawn to scale. For example, the dimensions of some of the elements in the figures may be exaggerated relative to other elements to help to improve understanding of various embodiments. Furthermore, the apparatus and method components have been represented where appropriate by conventional symbols in the figures, showing only those specific details that are pertinent to understanding the disclosed embodiments so as not to obscure the disclosure with details that will be readily apparent to those having skill in the relevant art having the benefit of this description.

DETAILED DESCRIPTION

In one embodiment, a system includes an RF receiver having an adjustable gain. The receiver is configured to receive a wideband RF signal while tuned to a channel of interest, and to convert the received wideband RF signal to a wideband baseband current signal. The system also includes a current replicator that is coupled to the receiver, and that is configured to generate a mirrored current of the wideband baseband current signal. The system also includes a wideband signal-level detector that is configured to receive the mirrored current from the current replicator, and to measure and output a signal-level value of the mirrored current. The system also includes an automatic gain-control circuit (AGC) that is configured to receive the signal-level value from the wideband signal-level detector, and to adjust the gain of the receiver based at least in part on the received signal-level value.

Figure 1:
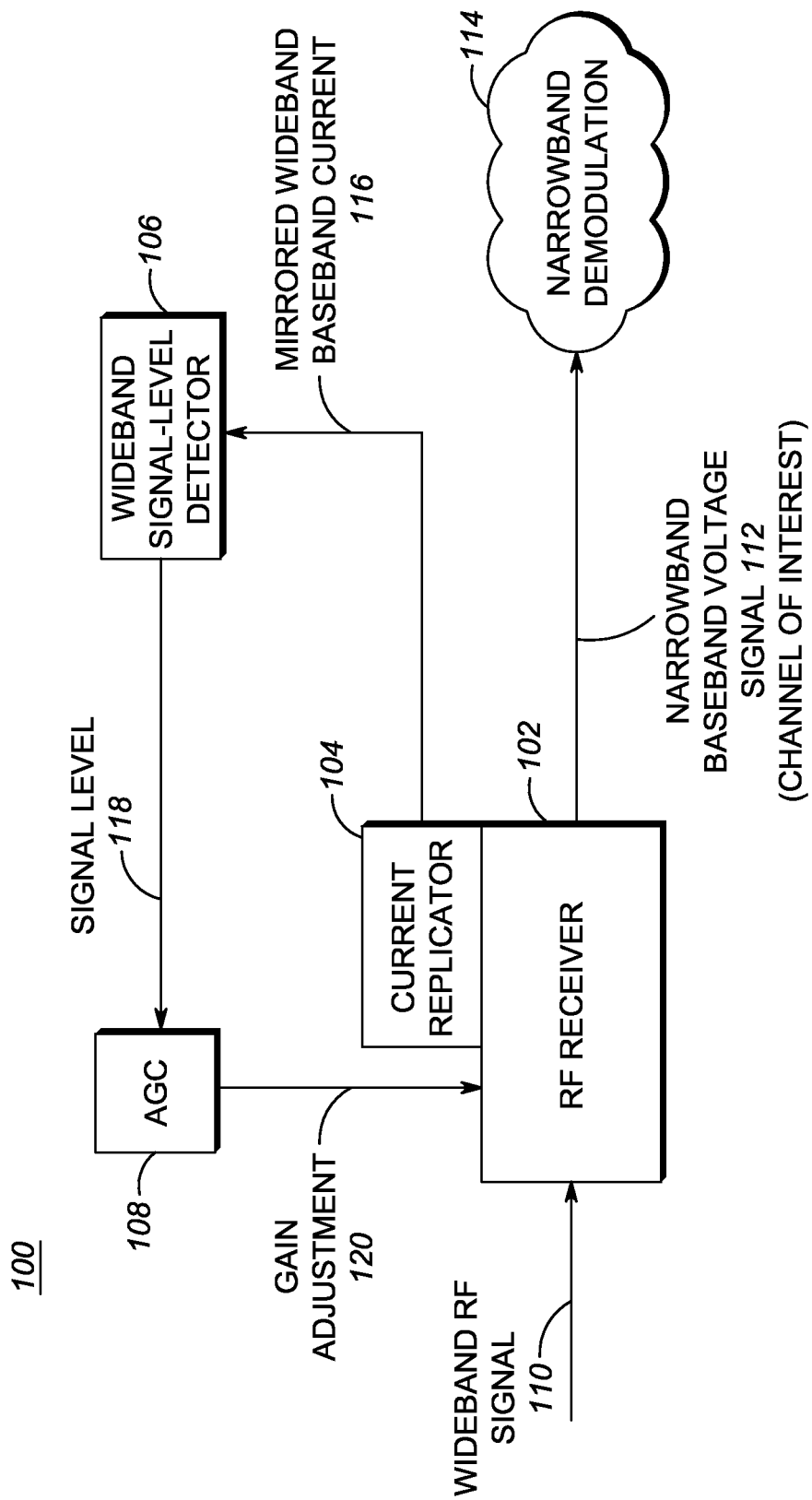
FIG. 1 depicts a system in accordance with at least one embodiment.

FIG. 1 depicts a system 100 that includes an RF receiver 102, a current replicator 104, a wideband signal-level detector 106, and an AGC 108. Receiver 102 has an adjustable gain, and is configured to receive a wideband RF signal 110 while tuned to a channel of interest. As depicted in FIG. 1, receiver 102 outputs for narrowband demodulation, which is shown generally at 114, a narrowband (baseband) voltage signal 112 that contains the channel of interest.

Receiver 102 is also configured, as part of generating narrowband voltage signal 112, to (e.g., direct) convert wideband RF signal 110 to a wideband baseband current signal, which in at least one embodiment includes information about a part of wideband RF signal 110 that is up to 500 MHz away from the channel of interest. Current replicator 104, which is coupled to receiver 102, is configured to generate a mirrored current of this wideband baseband current signal. This mirrored current is denoted mirrored wideband baseband current 116 in FIG. 1, and is output from current replicator 104 to wideband signal-level detector 106.

In addition to being configured to receive mirrored wideband baseband current 116 from current replicator 104, wideband signal-level detector 106 is also configured to measure and output a signal-level value of mirrored wideband baseband current 116. This signal-level value is denoted signal level 118 in FIG. 1, and is output from wideband signal-level detector 106 to AGC 108. In addition to being configured to receive signal level 118 from wideband signal-level detector 106, AGC 108 is also configured to adjust the gain of receiver 102 based at least in part on signal level 118. This function is depicted in FIG. 1 as gain adjustment 120. And certainly other configurations are possible as well, as FIG. 1 is provided by way of illustration and not limitation.

Figure 2:
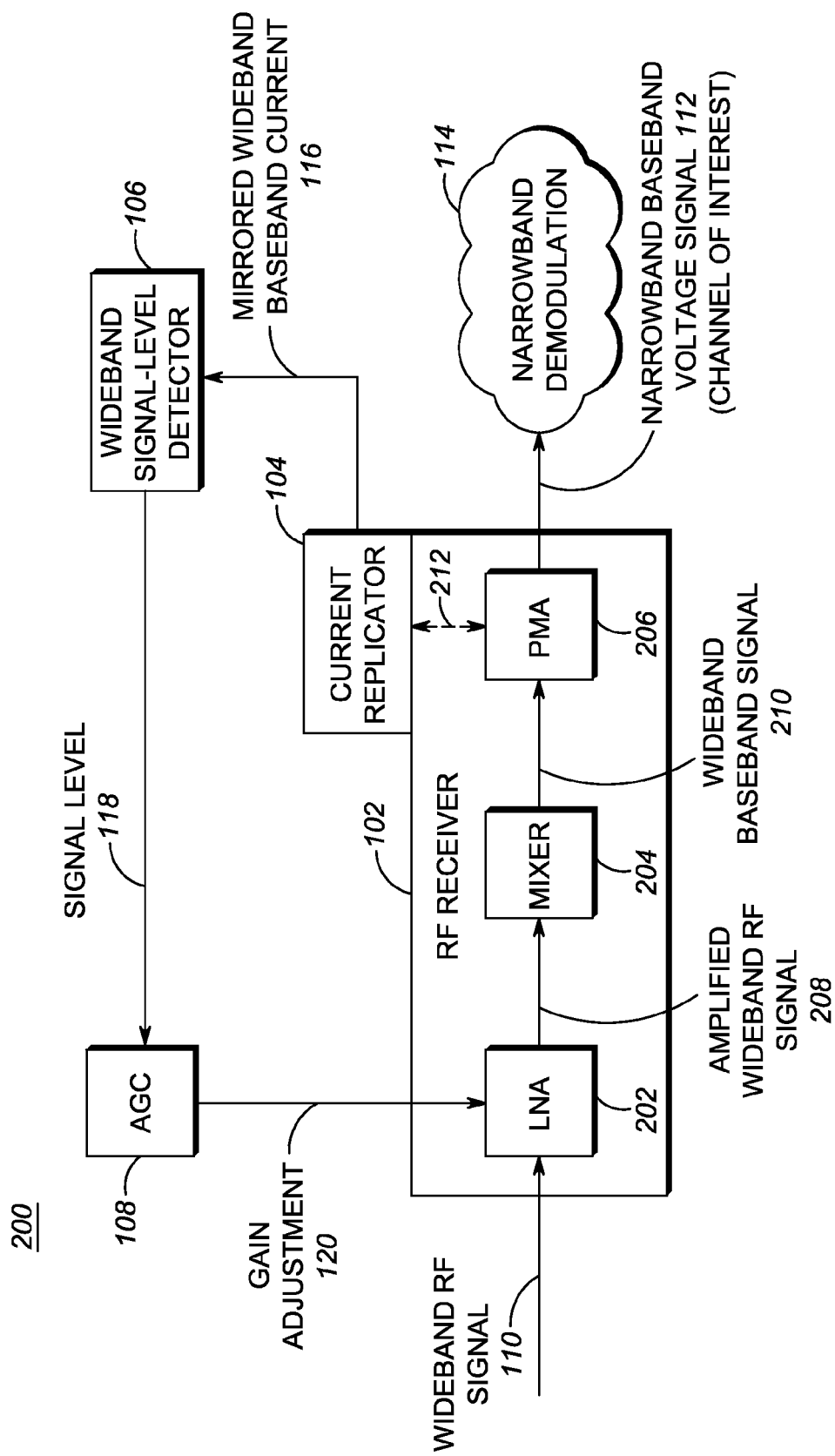
FIG. 2 depicts the system of FIG. 1 in accordance with at least one embodiment.

FIG. 2 depicts a system 200 that has all of the elements of system 100 of FIG. 1, though the depiction of system 200 in FIG. 2 provides additional detail about receiver 102 and current replicator 104. In particular, FIG. 2 depicts receiver 102 as including a low-noise amplifier (LNA) 202, a mixer 204, and a post-mixer amplifier (PMA) 206. With respect to the coupling between receiver 102 and current replicator 104, FIG. 1 shows this in a general way, while FIG. 2 shows that, in at least one embodiment, this coupling is between current replicator 104 and PMA 206, as shown by the connection 212, though it is noted that connection 212 could take a number of different forms in various implementations, and it is further noted that connection 212 is intended only to illustrate generally that, in some embodiments, PMA 206 is the part of receiver 102 at which current replicator 104 is coupled to receiver 102. FIG. 2 also shows that, in at least one embodiment, LNA 202 receives wideband RF signal 110, perhaps from an antenna structure and/or one or more other components of receiver 102. In at least one embodiment, it is LNA 202—itself having an adjustable gain—that receives (and implements) the gain adjustment control signal(s) 120 from AGC 108.

Moreover, FIG. 2 shows that, in at least one embodiment, LNA 202 outputs an amplified wideband RF signal 208 to mixer 204, which in turn converts (e.g., direct converts) amplified wideband RF signal 208 to a wideband baseband signal 210. In at least one embodiment, LNA 202 acts as what is known in the art as a trans-conductance amplifier (TCA), which is an amplifier that converts (and amplifies) an input voltage signal (110) into an output current signal (208). Moreover, the modifier "wideband" in this context indicates that all (or substantially all) of the spectral information present in wideband RF signal 110 is also represented in amplified wideband RF signal 208, wideband baseband signal 210, and is therefore also represented in mirrored wideband baseband current 116. And certainly other configurations are possible as well, as FIG. 2 is provided by way of illustration and not limitation.

Figure 3:
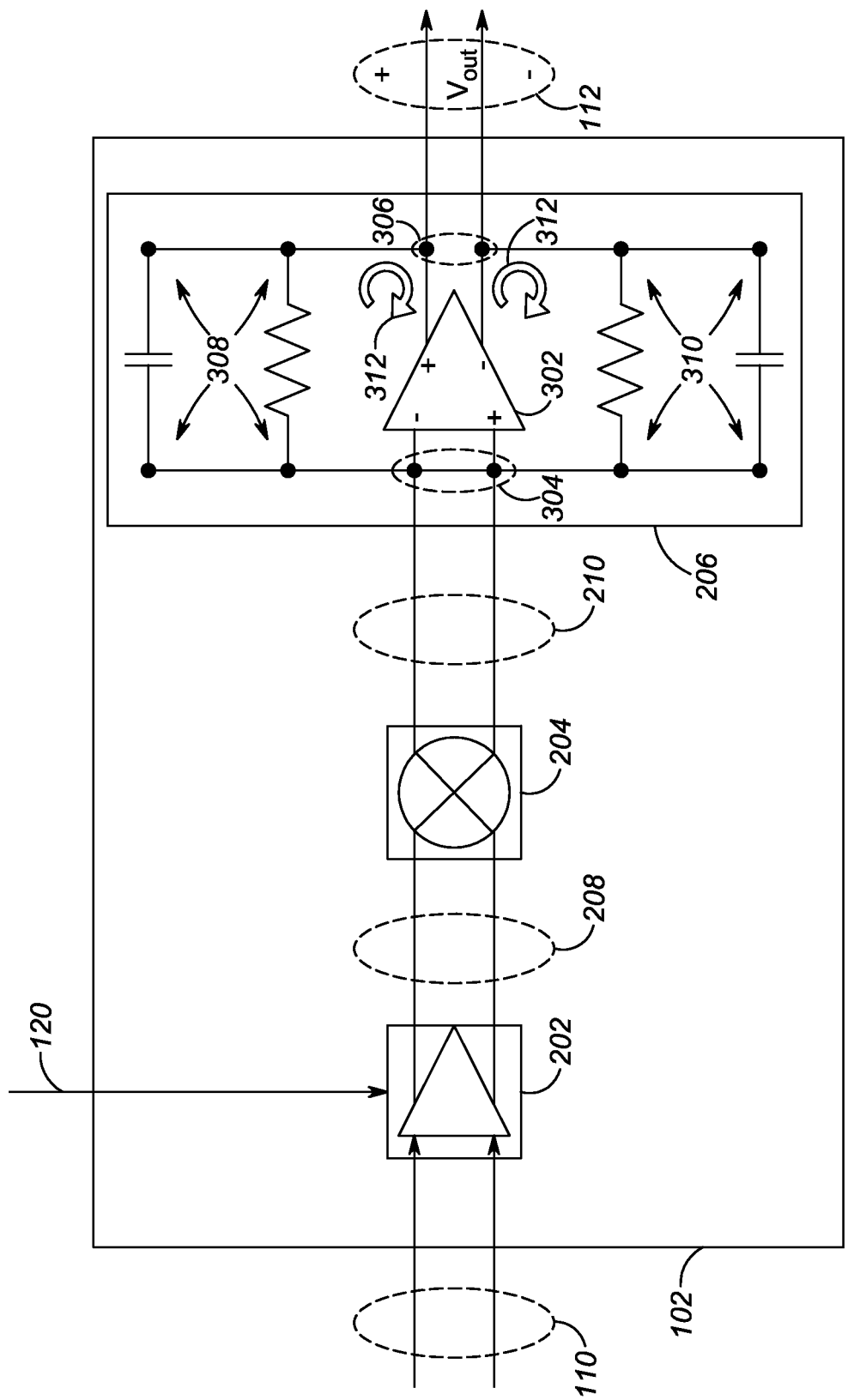
FIG. 3 depicts a front end of a current-mode radio-frequency (RF) receiver in accordance with at least one embodiment.

FIG. 3 depicts receiver 102 in additional detail, while still depicting the aspects of receiver 102 that are shown in FIG. 2, such as LNA 202, mixer 204, and PMA 206, as well as signals 110, 112, 120, 208, and 210. With respect to signals 110, 112, 208, and 210, FIG. 3 depicts each of these signals traveling along two conductors (e.g., wires or other connections) represented by pairs of parallel arrows or lines, showing that these signals may be differential in nature, an approach that is known to those of skill in the art, though it is noted that these signals and indeed the system as a whole could be realized and represented as being what are known in the art as single-ended signals and a single-ended system, respectively.

PMA 206 is depicted in FIG. 3 as including an operational amplifier (op-amp) 302 that has a pair of differential inputs 304. Op-amp 302 also has a pair of differential outputs 306 across which the "$V_{out}$" (narrowband baseband voltage) signal 112 is present. PMA 206 also has feedback paths 308 and 310, each of which extends between a differential output 306 and a differential input 304. Furthermore, each of the feedback paths 308 and 310 includes a resistor in parallel with a capacitor. As is known in the art, this arrangement results in the signal 112 being a low-pass response (i.e., a response that contains only the channel of interest, which is now centered at or near zero Hz, perhaps +/−about 10 MHz in an embodiment). PMA 206 thus acts in at least one embodiment as what is known in the art as a trans-impedance amplifier (TIA), which is an amplifier that converts (and amplifies) an input current signal (210) into an output voltage signal (112).

Thus, the primary output 306 of the PMA 206 is limited in bandwidth by the feedback paths 308 and 310, in order to remove off-channel signals from the primary receiver path, which leads to narrowband demodulation as depicted at 114 in FIGS. 1 and 2. Because the differential inputs 304 of op-amp 302 have input impedances that are effectively infinite, and further because the demodulation stage 114 to which the differential outputs 306 are connected has a very high impedance as well, it is the case that the current (denoted 312 in FIG. 3) that is present on each of the feedback paths 308 and 310 is effectively equal to the current signal 210 that is present at the differential inputs 304 of op-amp 302. In at least one embodiment, it is current 312 that is mirrored (i.e., replicated) by current replicator 104 so as to generate the mirrored wideband baseband current 116.

Furthermore, because current signal 210 is, as established above, a wideband baseband current signal, the feedback current 312 is a wideband baseband current signal as well. Thus, the mirrored wideband baseband current 116 that current replicator 104 generates based on feedback current 312 is wideband as well. As such, the wideband RF information present in wideband RF signal 110 is also present in mirrored wideband baseband current 116. In at least one embodiment, the wideband baseband signal 210, and thus also the mirrored wideband baseband current 116, includes information about a part of the received wideband RF signal 110 that is up to 500 MHz away from the channel of interest.

In addition, while FIG. 3 depicts a single mixer 204 having a pair of differential inputs on the left and a pair of differential outputs on the right, multiple mixers are used in some embodiments, as is shown in ensuing figures and as is explained further below. For example, some embodiments (including both single-ended embodiments and differential embodiments) use two mixers 204: one for what is known in the art as the "in-phase" (or just "I") component of the received signal, the other for what is known in the art as the "quadrature" (or just "Q") component of the received signal. In such embodiments, each such mixer outputs its respective component to a different op-amp. And certainly other configurations are possible as well, as FIG. 3 is provided by way of illustration and not limitation.

Figure 4:
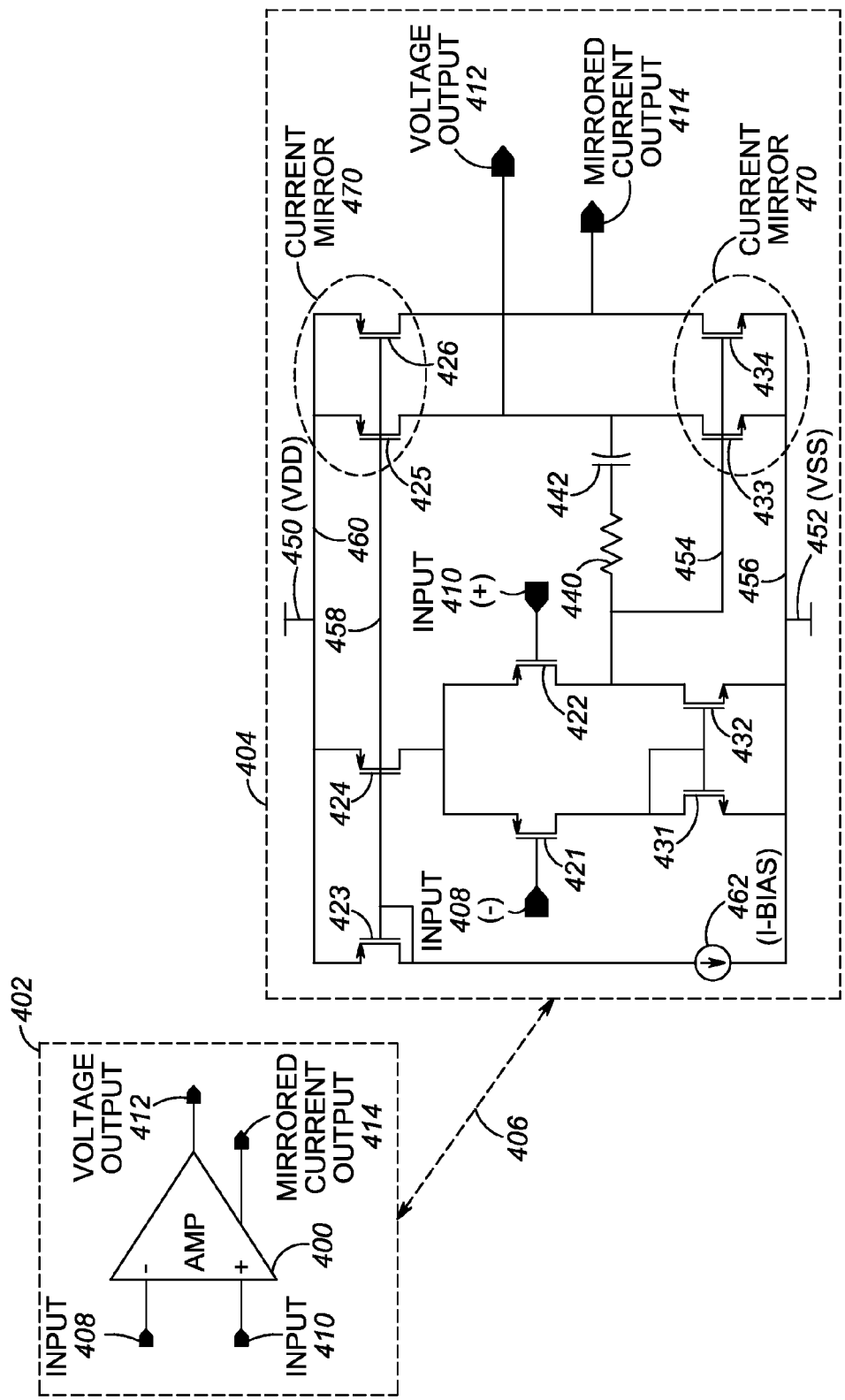
FIG. 4 depicts a circuit-diagram-symbol view and a circuit-diagram view of an example configuration of an amplifier configured together with a current replicator (mirror), where this example configuration may be used in a single-ended implementation in connection with at least one embodiment.

FIG. 4 depicts a circuit-diagram-symbol view and a circuit-diagram view of an example configuration of an amplifier configured together with a current replicator (mirror), where this example configuration may be used in a single-ended implementation in connection with at least one embodiment. Thus, in some embodiments, the configuration depicted in FIG. 4 represents PMA 206 configured together with current replicator 104. In such embodiments, mirrored wideband baseband current 116 is made up in whole or at least in part of a current signal output from the mirrored current output 414 of FIG. 4.

FIG. 4 includes a circuit-diagram-symbol view 402 and a circuit-diagram view 404, and includes an arrow 406 between the views 402 and 404 to reinforce that these are two different views of the same example configuration. The view 402 shows an operational amplifier 400 having a negative input 408, a positive input 410, a voltage output 412, and the mirrored current output 414. The view 404 also shows the negative input 408, the positive input 410, the voltage output 412, and the mirrored current output 414. As mentioned above, the inputs 408 and 410 may be coupled to corresponding outputs of a mixer such as mixer 204. The voltage output 412 may be coupled to narrowband demodulation 114 and may accordingly output narrowband baseband voltage signal 112. And as also mentioned above, mirrored current output 414 may output mirrored wideband baseband current 116 to wideband signal-level detector 106.

As shown in FIG. 4, the example view 404 includes P-type metal-oxide semiconductor field-effect transistors (MOSFETs) 421, 422, 423, 424, 425, and 426. View 404 also includes N-type MOSFETs 431, 432, 433, and 434, and further includes a current source labeled 462 (I-BIAS). Moreover, at least N-type MOSFET 433 may act as what is known in the art as a common-source amplifier. Furthermore, the depicted arrangement of resistor 440 and capacitor 442 may be included in order to stabilize the amplifier to reduce or eliminate oscillation.

It can be seen in FIG. 4 (at current mirror 470) that the current-replicator function is implemented at least in part by N-type MOSFETs 433 and 434 both having their respective gates connected to a conductor 454, and further both having their respective source terminals connected to a conductor 456, which itself is connected to a ground 452 (VSS). It can also be seen in FIG. 4 (at current mirror 470) that the current replicator function is further implemented at least in part by the P-type MOSFETs 425 and 426 both having their respective gates connected to a conductor 458, and further both having their respective drain terminals connected to a conductor 460, which itself is connected to a power source 450 (VDD). And certainly other configurations are possible as well, as FIG. 4 is provided by way of illustration and not limitation.

Figure 5:
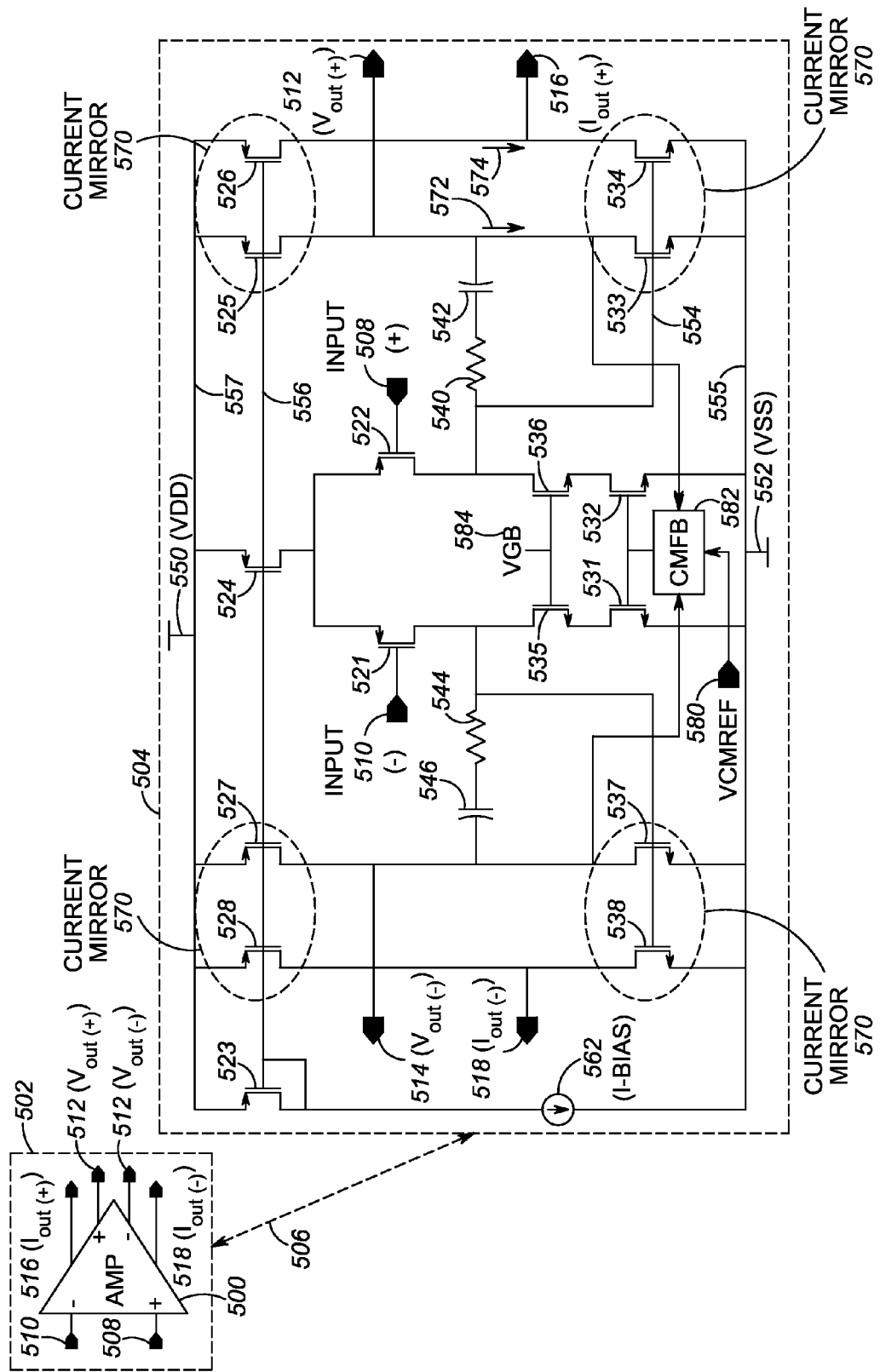
FIG. 5 depicts a circuit-diagram-symbol view and a circuit-diagram view of an example configuration of an amplifier configured together with a current replicator (mirror), where this example configuration may be used in a differential implementation in connection with at least one embodiment.

FIG. 5 depicts a circuit-diagram-symbol view and a circuit-diagram view of an example configuration of an amplifier configured together with a current replicator (mirror), where this example configuration may be used in a differential implementation in connection with at least one embodiment. Thus, in some embodiments, the configuration depicted in FIG. 5 represents PMA 206 configured together with current replicator 104. In such embodiments, mirrored wideband baseband current 116 is made up in whole or at least in part of current signals output from the differential pair of current outputs 516 ($I_{out(+)}$) and 518 ($I_{out(-)}$) of FIG. 5.

FIG. 5 includes a circuit-diagram-symbol view 502 and a circuit-diagram view 504, and includes an arrow 506 between the views 502 and 504 to reinforce that these are two different views of the same example configuration. The view 502 shows an operational amplifier 500 having a positive input 508, a negative input 510, a positive voltage output 512 ($V_{out(+)}$), a negative voltage output 514 ($V_{out(-)}$), a positive current output 516 ($I_{out(+)}$), and a negative current output 518 ($I_{out(-)}$). The view 504 also shows the positive input 508, the negative input 510, the positive voltage output 512 ($V_{out(+)}$), the negative voltage output 514 ($V_{out(-)}$), the positive current output 516 ($I_{out(+)}$), and the negative current output 518 ($I_{out(-)}$). As mentioned, the inputs 508 and 510 may be coupled to corresponding outputs of a mixer such as mixer 204. The pair of differential voltage outputs 512 and 514 may be coupled to narrowband demodulation 114 and may accordingly output narrowband baseband voltage signal 112. And as also mentioned above, the differential pair of current outputs 516 and 518 may cooperate to output all or part of mirrored wideband baseband current 116 to wideband signal-level detector 106.

As shown in FIG. 5, the example view 504 includes P-type MOSFETs 521, 522, 523, 524, 525, 526, 527, and 528. View 504 also includes N-type MOSFETs 531, 532, 533, 534, 535, 536, 537, and 538, and further includes a current source labeled 562 (I-BIAS), as well as reference-voltage inputs 580 (VCMREF) and 584 (VGB), along with a common-mode feedback (CMFB) 582. Moreover, at least N-type MOSFETs 533 and 537 may act as what are known in the art as common-source amplifiers. Furthermore, the depicted arrangements of (i) resistor 540 and capacitor 542 and (ii) resistor 544 and capacitor 546 may be included in order to stabilize the amplifier to reduce or eliminate oscillation.

It can be seen in FIG. 5 (at current mirror 570) that the current-replicator function is implemented at least in part by (i) N-type MOSFETs 533 and 534 both having their respective gates connected to a conductor 554, and further both having their respective source terminals connected to a conductor 555, which itself is connected to a ground 552 (VSS) and (ii) N-type MOSFETs 537 and 538 both having their respective gates connected to a common conductor, and further both having their respective source terminals connected to the conductor 555. It can also be seen in FIG. 5 (at current mirror 570) that the current replicator function is further implemented at least in part by (i) P-type MOSFETs 525 and 526 both having their respective gates connected to a conductor 556, and further both having their respective sources connected to a conductor 557, which itself is connected to a power source 550 (VDD) and (ii) P-type MOSFETs 527 and 528 both having their respective gates connected to the conductor 556, and further both having their respective sources connected to the conductor 557. And certainly other configurations are possible as well, as FIG. 6 is provided by way of illustration and not limitation.

Figure 6:
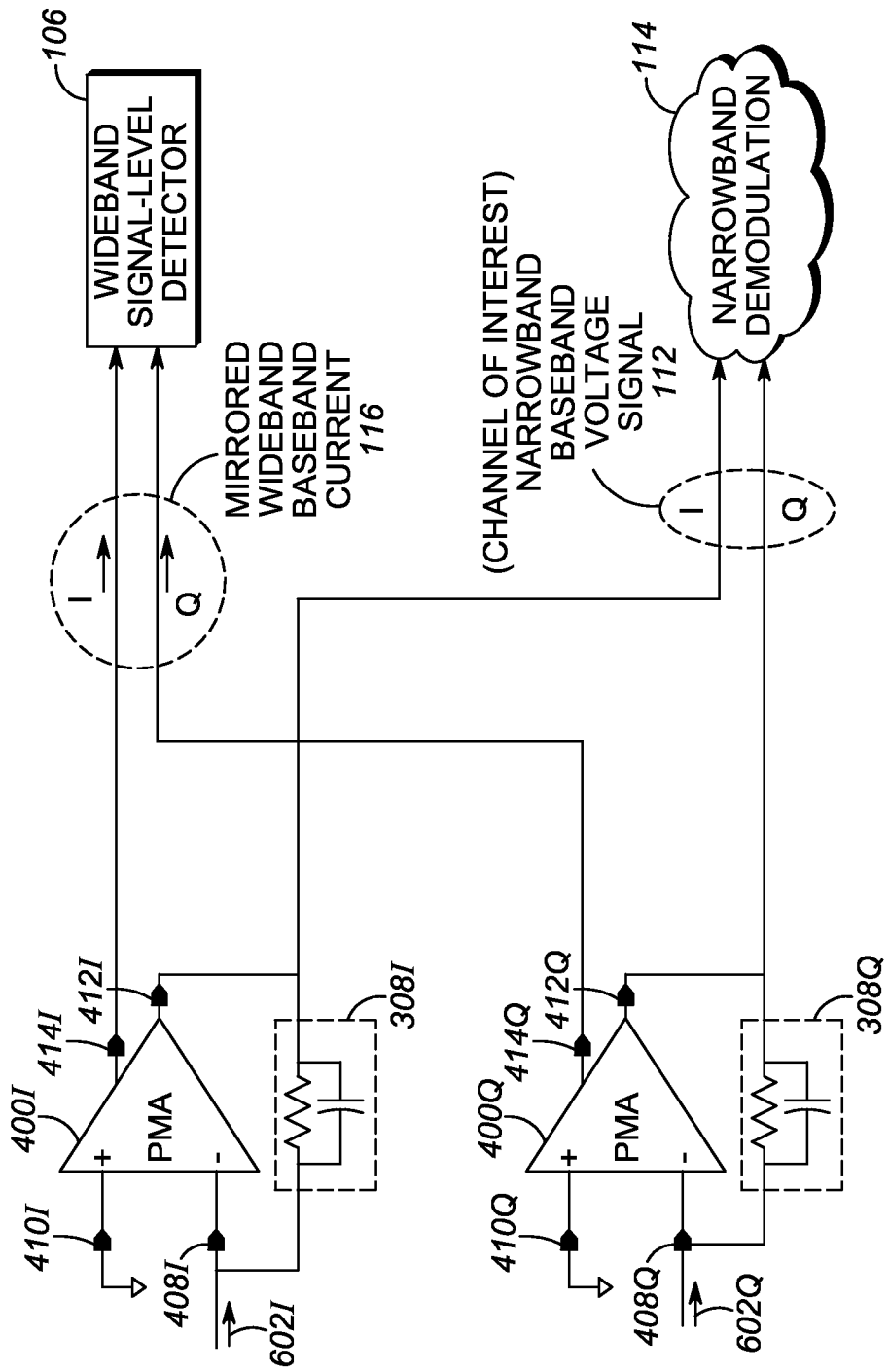
FIG. 6 depicts aspects of a single-ended implementation of the system of FIG. 1 in which respective current-mode post-mixer amplifiers (PMAs) process in-phase (I) and quadrature (Q) components of a received signal, in accordance with at least one embodiment.

FIG. 6 depicts aspects of a single-ended implementation of the system of FIG. 1 in which respective current-mode PMAs process the in-phase (I) and quadrature (Q) components of a received signal, in accordance with at least one embodiment. In particular, FIG. 6 depicts incoming current signals 602I and 602Q from a current-mode I mixer (not depicted) and a current-mode Q mixer (not depicted), respectively. As stated, FIG. 6 depicts a single-ended implementation, and as such the respective I and Q PMAs 400I and 400Q may have structures and arrangements similar or identical to that of amplifier 400 of FIG. 4.

As can be seen in FIG. 6, each PMA 400I and 400Q receives its respective input signal at its respective negative input terminal 408 from a combination of its respective signal 602 and its respective feedback path 308, which may take on a form similar to that of feedback path 308 of FIG. 3. Moreover, each PMA 400I and 400Q has its respective positive input terminal 410 connected to AC ground. The current outputs 414I and 414Q are output as mirrored wideband baseband current 116 to wideband signal-level detector 106, and the voltage outputs 412I and 412Q are output as narrowband baseband voltage signal 112 to narrowband demodulation 114. And certainly other configurations are possible as well, as FIG. 6 is provided by way of illustration and not limitation.

Figure 7:
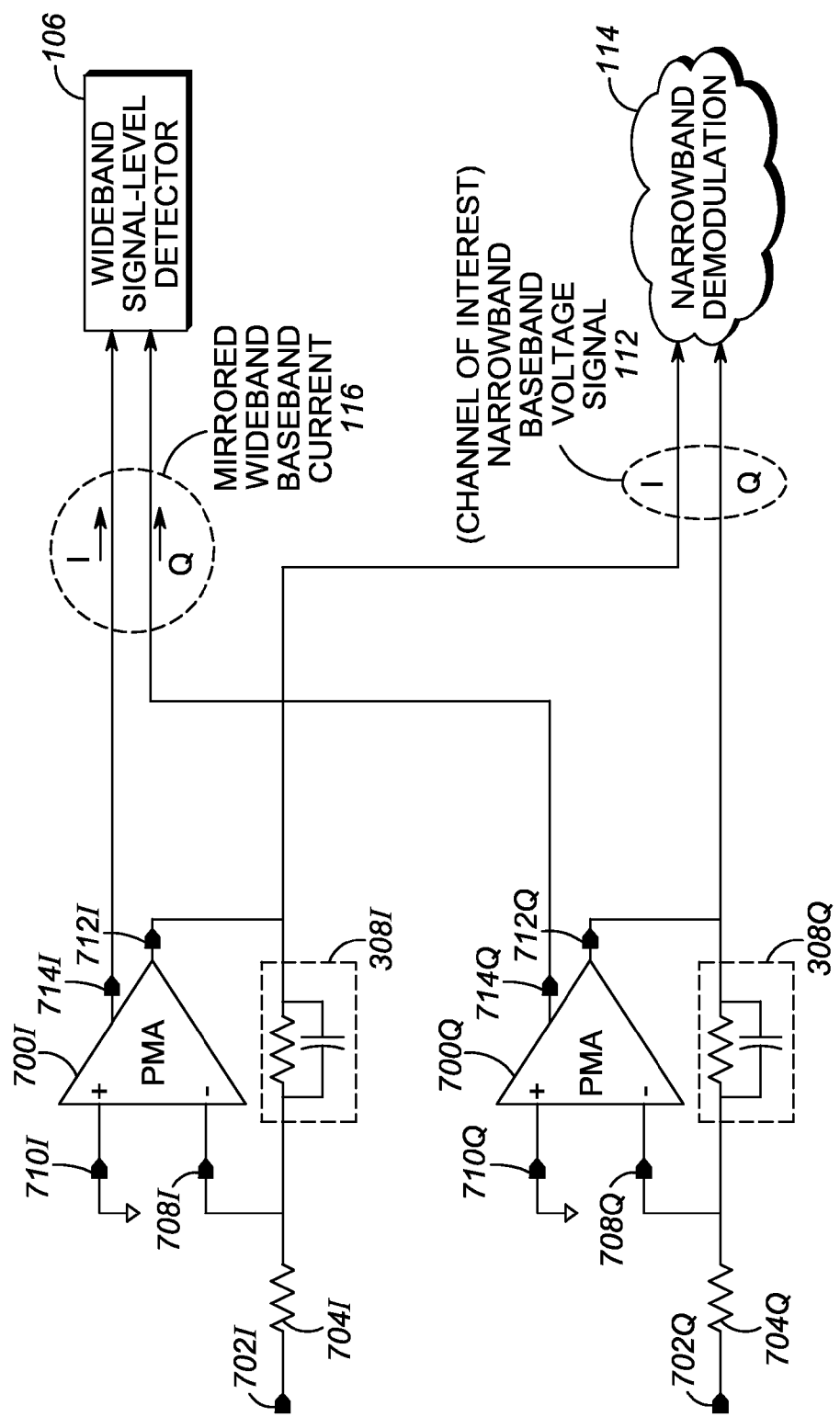
FIG. 7 depicts aspects of a single-ended implementation of the system of FIG. 1 in which respective voltage-mode PMAs process in-phase (I) and quadrature (Q) components of a received signal, in accordance with at least one embodiment.

FIG. 7 depicts aspects of a single-ended implementation of the system of FIG. 1 in which respective voltage-mode PMAs process the in-phase (I) and quadrature (Q) components of a received signal, in accordance with at least one embodiment. In particular, FIG. 7 depicts incoming voltage signals 702I and 702Q from a voltage-mode I-current mixer (not depicted) and a voltage-mode Q-current mixer (not depicted), respectively. As stated, FIG. 7 depicts a single-ended implementation, and as such the respective I and Q PMAs 700I and 700Q may have structures and arrangements similar or identical to that of amplifier 400 of FIG. 4.

As can be seen in FIG. 7, each PMA 700I and 700Q receives its respective input signal at its respective negative input terminal 708 from a combination of its respective signal 702 (across a respective resistor 704) and its respective feedback path 308, which may take on a form similar to that of feedback path 308 of FIG. 3. Moreover, each PMA 700I and 700Q has its respective positive input terminal 710 connected to AC ground. It is noted that the arrangement of FIG. 7 could be altered in that the polarity of the inputs of the respective voltage-mode PMAs 700I and 700Q could be reversed, with the inputs 702I and 702Q connected to the positive terminal of the respective PMAs and the left sides of resistors 704I and 704Q connected to AC ground, though doing so tends to have the effect of reducing the bandwidth of spectral information represented in mirrored wideband baseband current 116. The current outputs 714I and 714Q are output as mirrored wideband baseband current 116 to wideband signal-level detector 106, and the voltage outputs 712I and 712Q are output as narrowband baseband voltage signal 112 to narrowband demodulation 114. And certainly other configurations are possible as well, as FIG. 7 is provided by way of illustration and not limitation.

Figure 8:
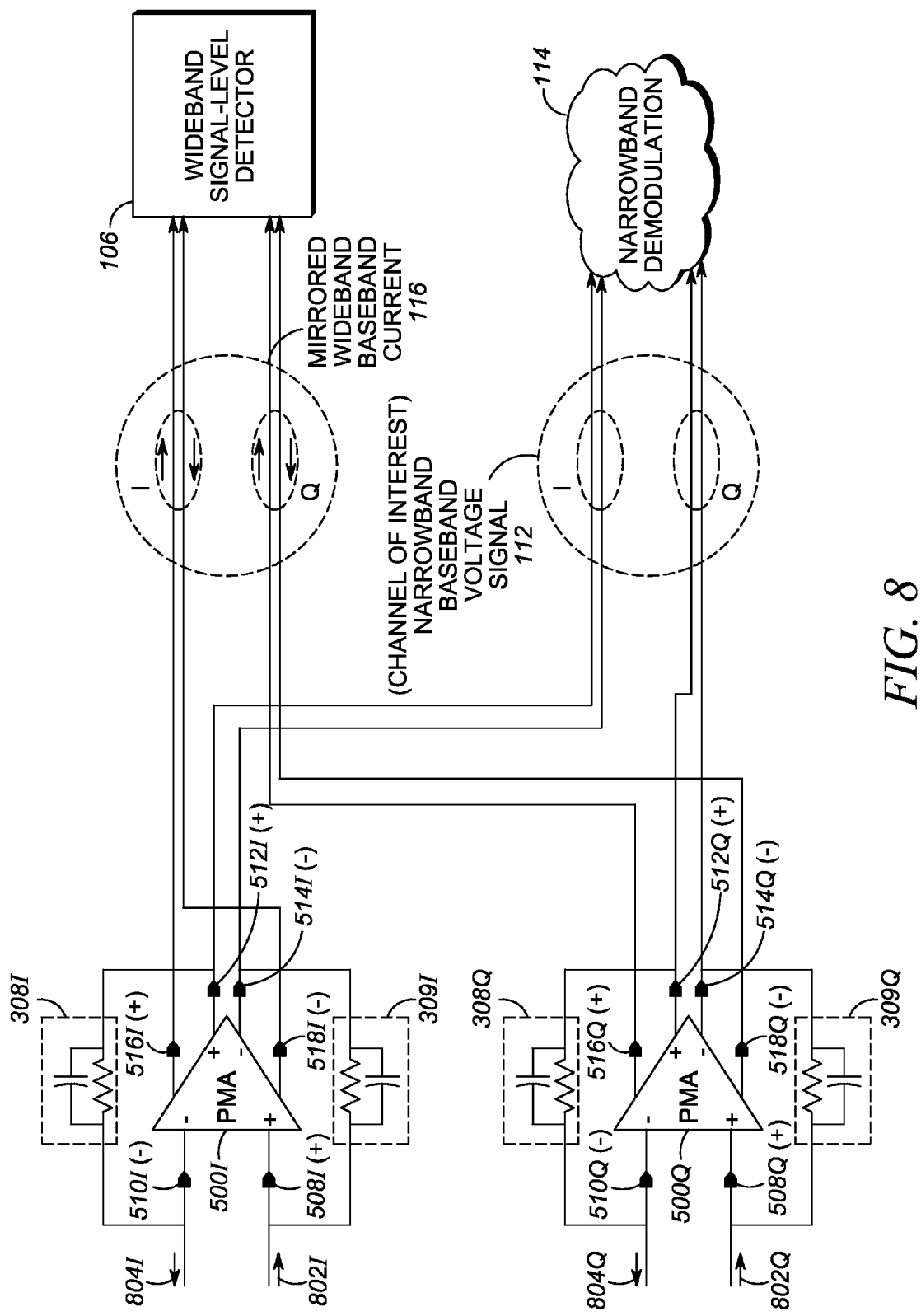
FIG. 8 depicts aspects of a differential implementation of the system of FIG. 1 in which respective current-mode PMAs process in-phase (I) and quadrature (Q) components of a received signal, in accordance with at least one embodiment.

FIG. 8 depicts aspects of a differential implementation of the system of FIG. 1 in which respective current-mode PMAs process the in-phase (I) and quadrature (Q) components of a received signal, in accordance with at least one embodiment. As such, FIG. 8 is essentially depicts in a differential implementation of what FIG. 6 depicts in a single-ended implementation. The respective PMAs 500I and 500Q may each take on a structure and arrangement similar or identical to that depicted and described with respect to the amplifier 500 of FIG. 5, and each may have respective feedback paths 308 and 309 each similar or identical to feedback path 308 of FIG. 3.

FIG. 8 shows differential input current signals 802I and 804I coming from a differential current-mode I-current mixer (not depicted), and further shows differential input current signals 802Q and 804Q coming from a differential current-mode Q-current mixer (not depicted). Each PMA 500 receives its input signals at input terminals 508(+) and 510(−) from combinations of the input current 802 and the feedback path 309 at its respective terminal 508(+), and of the input current 804 and the feedback path 308 at its respective terminal 510(−). FIG. 8 further depicts that the current outputs 516I(+)/518I(−) and 516Q(+)/518Q(−) are output as mirrored wideband baseband current 116 to wideband signal-level detector 106, and the voltage outputs 512I(+)/514I(−) and 512Q(+)/514Q(−) are output as narrowband baseband voltage signal 112 to narrowband demodulation 114. And certainly other configurations are possible as well, as FIG. 8 is provided by way of illustration and not limitation.

Figure 9:
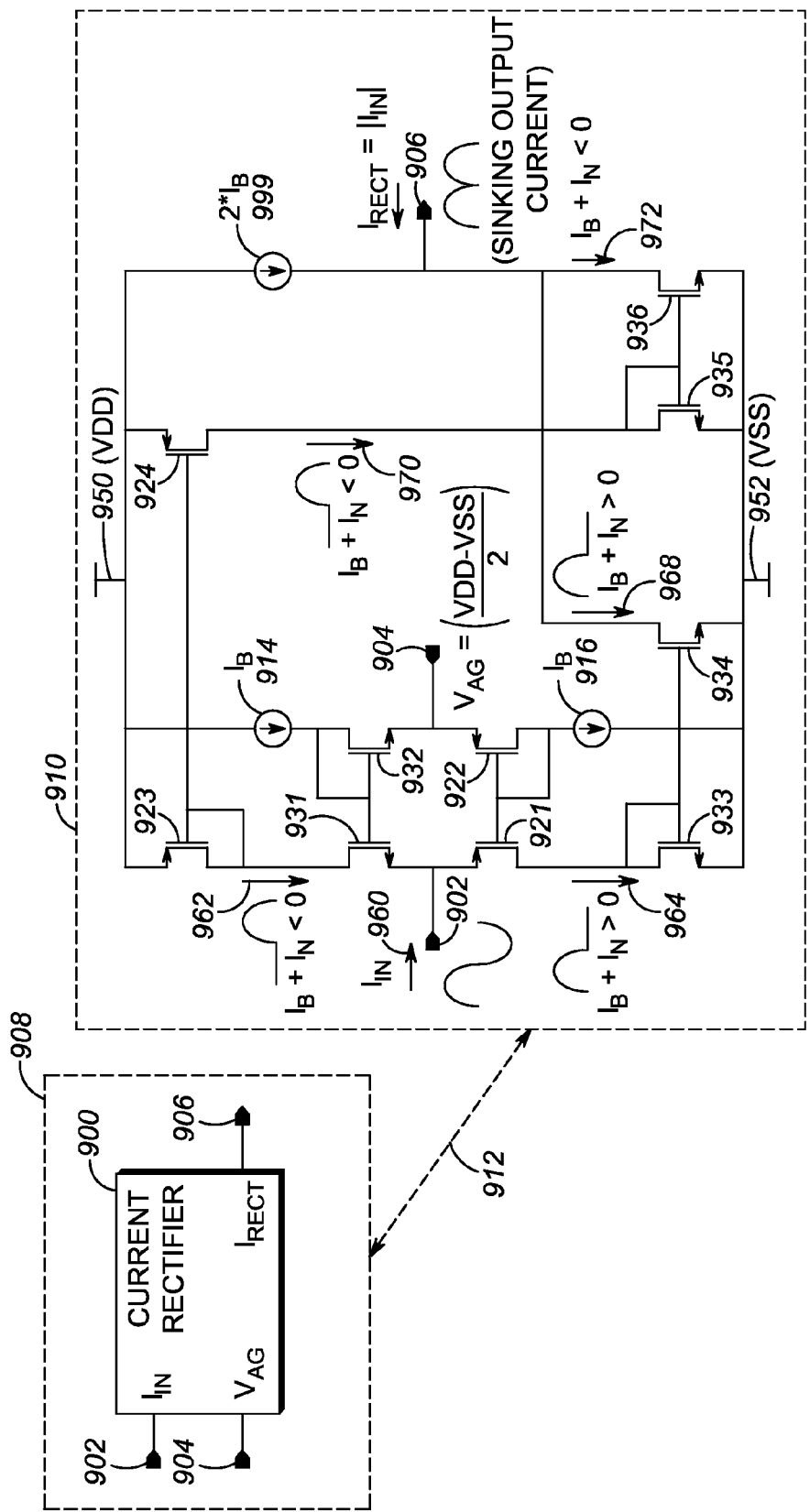
FIG. 9 depicts a circuit-diagram-symbol view and a circuit-diagram view of an example wideband full-wave current rectifier that could be used in a differential implementation of the system of FIG. 1, in accordance with at least one embodiment.

FIG. 9 depicts a circuit-diagram-symbol view and a circuit-diagram view of an example wideband full-wave current rectifier that could be used in a single-ended or in a differential implementation of the system of FIG. 1, in accordance with at least one embodiment. As described below in connection with FIG. 10, multiple instances of current rectifiers such as the described current rectifier 900 could be used in a given implementation. As further described below in connection with FIG. 11, such a configuration of multiple instances of current rectifier 900 could make up an entity such as the rectifier 1102. Furthermore, it is noted that, in some embodiments, a voltage rectifier (preceded by a current-to-voltage converter), or multiple instances thereof, is used in place of a current rectifier, though in general a current rectifier operates at a greater bandwidth than does a voltage rectifier.

FIG. 9 includes a circuit-diagram-symbol view 908 and a circuit-diagram view 910, and includes an arrow 912 between the views 908 and 910 to reinforce that these are two different views of the same example configuration. The view 908 shows the current rectifier 900 having a current input ($I_N$) 902, a voltage input ($V_{AG}$) 904, and a rectified-current output ($I_{RECT}$) 906. The view 910 also shows the current input ($I_N$) 902, the voltage input ($V_{AG}$) 904 (where "AG" denotes "Analog Ground"), and the rectified-current output ($I_{RECT}$) 906. The view 910 shows a current 960 received at input 902, and further shows current sources $I_B$ 914 and $I_B$ 916, as well as current source 999, equal in value to ($2*I_B$). Also depicted are power source 950 (VDD) and ground 952 (VSS). Furthermore, the voltage input ($V_{AG}$) 904 is set to equal in the depicted embodiment to half of the difference between the values of VDD 950 and VSS 952, though other reference voltages could be used for the voltage input 904 in other embodiments. View 910 also shows P-type MOSFETs 921, 922, 923, and 924, as well as N-type MOSFETs 931, 932, 933, 934, 935, and 936. Furthermore, in addition to the input current 960, view 910 depicts currents 962, 964, 968, 970, and 972. Finally, view 910 indicates that the rectified-current output ($I_{RECT}$) 906 outputs a current that is a rectified (i.e., absolute-value) version of the current 960 received at the current input ($I_N$) 902. And certainly other configurations are possible as well, as FIG. 9 is provided by way of illustration and not limitation.

Figure 10:
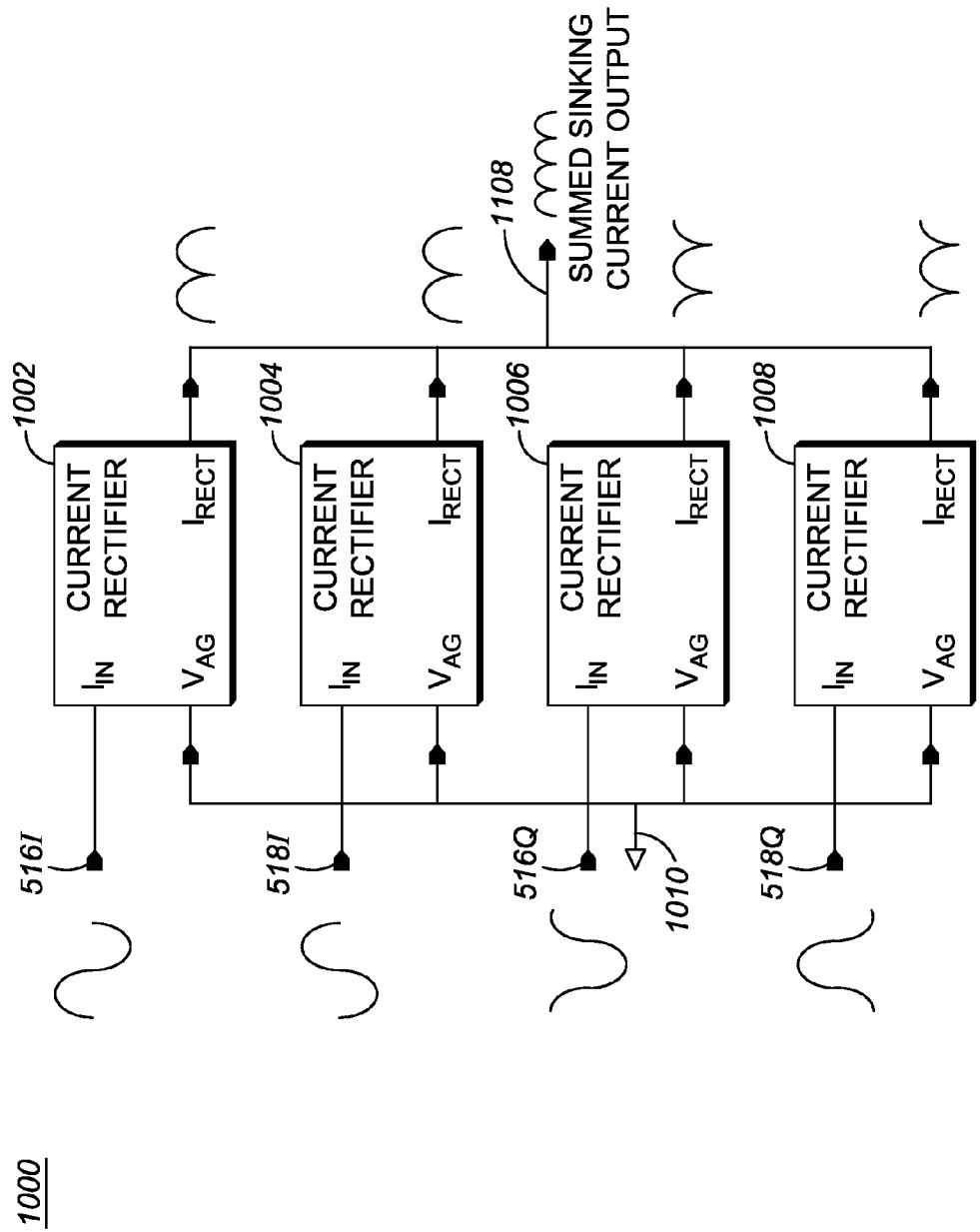
FIG. 10 depicts multiple instances of the current rectifier of FIG. 9, connected and configured in an arrangement that could be used in a differential implementation of the system of FIG. 1, in accordance with at least one embodiment.

FIG. 10 depicts multiple instances of the current rectifier of FIG. 9, connected and configured in an arrangement that could be used in a differential implementation of the system of FIG. 1, in accordance with at least one embodiment. As an example, FIG. 10 could be implemented as part of wideband signal-level detector 106 in embodiments similar to the embodiment that is depicted in FIG. 8, and is numbered as such. Thus, it can be seen that FIG. 10 depicts four interconnected current rectifiers 1002, 1004, 1006, and 1008, each of which may have a structure and arrangement similar to that of the current rectifier 900 of FIG. 9.

As depicted in FIG. 10, in the current rectifier 1000, current rectifier 1002 takes the signal 516I (from FIG. 8) as its current input ($I_N$); current rectifier 1004 takes the signal 518I (from FIG. 8) as its current input ($I_N$); current rectifier 1006 takes the signal 516Q (from FIG. 8) as its current input ($I_N$); and current rectifier 1008 takes the signal 518Q (from FIG. 8) as its current input ($I_N$). As can be appreciated from FIG. 8, in at least one embodiment, the input signals 516I, 518I, 516Q, and 518Q that are depicted in FIG. 10 collectively correspond to the mirrored wideband baseband current 116. Moreover, each of the four current rectifiers of FIG. 10 takes as its respective voltage ($V_{AG}$) input a common DC bias voltage 1010. Moreover, the respective rectified-current outputs ($I_{RECT}$) of the four the current rectifiers 1002, 1004, 1006, and 1008 are summed as shown in FIG. 10; in at least one embodiment, this summed current output that is depicted in FIG. 10 corresponds to the signal 1108 that is described below in connection with FIG. 11. And certainly other configurations are possible as well, as FIG. 10 is provided by way of illustration and not limitation.

Figure 11:
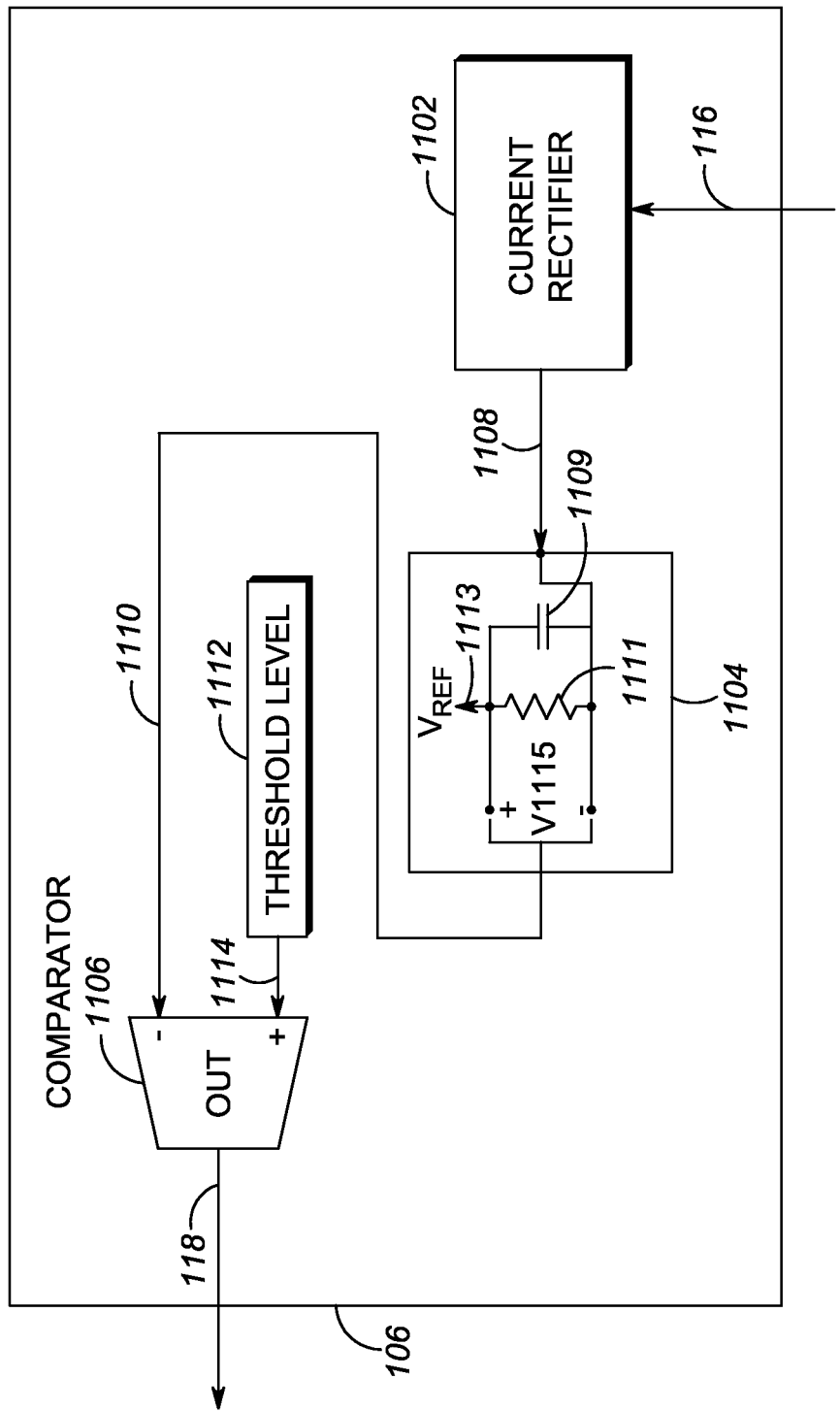
FIG. 11 depicts a wideband signal-level detector in accordance with at least one embodiment.

As shown in FIG. 11, in some embodiments the wideband signal-level detector 106 includes a current rectifier 1102 (that may take the form of the current rectifier 1000 of FIG. 10), a block 1104 for both current-to-voltage conversion and filtering, and a comparator 1106. As described herein, the wideband signal-level detector 106 may implement functions such as "rectify and sum," "sum of squares," and/or any other suitable functions known to those of skill in the art. Moreover, in some embodiments, the wideband signal-level detector 106 may include additional functional blocks such as a programmable current amplifier, for example. In some embodiments, the functions performed by any given block could be distributed across multiple functional blocks, as deemed suitable by those of skill in the art for a given implementation. As shown by FIGS. 8, 10, and 11 taken together, the current rectifier 1102 receives the mirrored wideband baseband current 116 (which is an AC current signal) and outputs a summed sinking current signal 1108 (which is a DC current signal), which is transmitted to the block 1104.

As shown in FIG. 11, in an embodiment, the block 1104 implements both a current-to-voltage-conversion function and a filtering function using a circuit that includes a capacitor 1109 in parallel with a resistor 1111, where the resistor 1111 is connected at one end to a reference voltage denoted $V_{REF}$ 1113 in FIG. 11. In the depicted embodiment, the summed sinking current signal 1108 is transformed into a low-pass-filtered voltage output 1110 by operation of the circuit depicted in block 1104, which is but one example implementation, as others could be chosen by those of skill in the art as being suitable in various contexts.

With respect to the components depicted in the block 1104, the resistor 1111 transforms the summed sinking current signal 1108 into a voltage signal with respect to the reference voltage $V_{REF}$ 1113, while the capacitor 1109 in parallel with the resistor 1111 realizes a low-pass filtering function. The filtered voltage signal 1110 that is output from the block 1104 represents the voltage $V_{1115}$ across the resistor 1111. Given the circuit arrangement depicted in FIG. 11, and in particular in the block 1104, greater magnitudes of the summed sinking current signal 1108 (corresponding to greater amounts of wideband RF energy present in the wideband RF signal 110) result in the filtered voltage signal 1110 having lesser magnitudes. Conversely, lesser magnitudes of the summed sinking current signal 1108 (corresponding to lesser amounts of wideband RF energy present in the wideband RF signal 110) result in the filtered voltage signal 1110 having greater magnitudes.

The comparator 1106 takes as its two inputs (i) the DC signal 1110 (at the "−" input) and (ii) a threshold signal level 1114 (at the "+" input) from a threshold level source 1112, which in some embodiments is itself an adjustable component, such that the threshold signal level 1114 to which comparator 1106 is comparing the signal 1110 could be adjusted. In an embodiment, the comparator 1106 has a Boolean output signal 118, equal to a first value when signal 1110 is less than signal 1114, and otherwise equal to a second value. In some embodiments, one of those two values, typically the second value, is effectively zero; that is, the comparator 1106 may be configured to produce an output signal 118 when signal 1110 is less than signal 1114, and to otherwise not produce an output signal. In other embodiments, the wideband signal-level detector 106 outputs not a Boolean signal but instead a measured strength of the mirrored wideband baseband current 116. And other examples are possible.

In at least one embodiment, AGC 108 is configured to decrease the gain of the receiver (e.g., by decreasing the gain of LNA 202) when the received signal-level value 118 is greater than a threshold (e.g., when signal 118 in the form of a Boolean signal indicates a high amount of wideband RF energy present in the wideband RF signal 110, or when a measured strength of the mirrored wideband baseband current 116 (perhaps as represented in a measured magnitude of a signal such as the summed sinking current signal 1108) indicates a high amount of wideband RF energy in the wideband RF signal 110, and the like). That is, in at least one embodiment, when at least one strong off-channel signal is detected, the gain of receiver 102 is reduced in order to, among other reasons, prevent overload and preserve the maximum possible dynamic range of receiver 102. As stated, in embodiments where signal 118 is Boolean in nature, AGC 108 may be configured to decrease the gain when signal 118 is equal to one value and increase the gain when signal 118 is equal to a different value (e.g., zero). And certainly other approaches are possible as well.

As stated, in some embodiments where signal 118 conveys an actual measured strength of signal 116, AGC 108 is configured to decrease the gain when the signal level 118 exceeds a given threshold and to increase the gain when the signal level 118 does not exceed the given threshold. In other embodiments, AGC is configured to decrease the gain when the signal level 118 exceeds an upper threshold and to increase the gain when the signal level 118 is less than a lower threshold (i.e., a threshold that is less than the upper threshold). And certainly other possibilities could be implemented as well, including but not limited to the AGC 108 being configured to increase the gain when the signal level 118 is less than a given threshold. And certainly other configurations are possible as well, as FIG. 11 is provided by way of illustration and not limitation.

Figure 12:
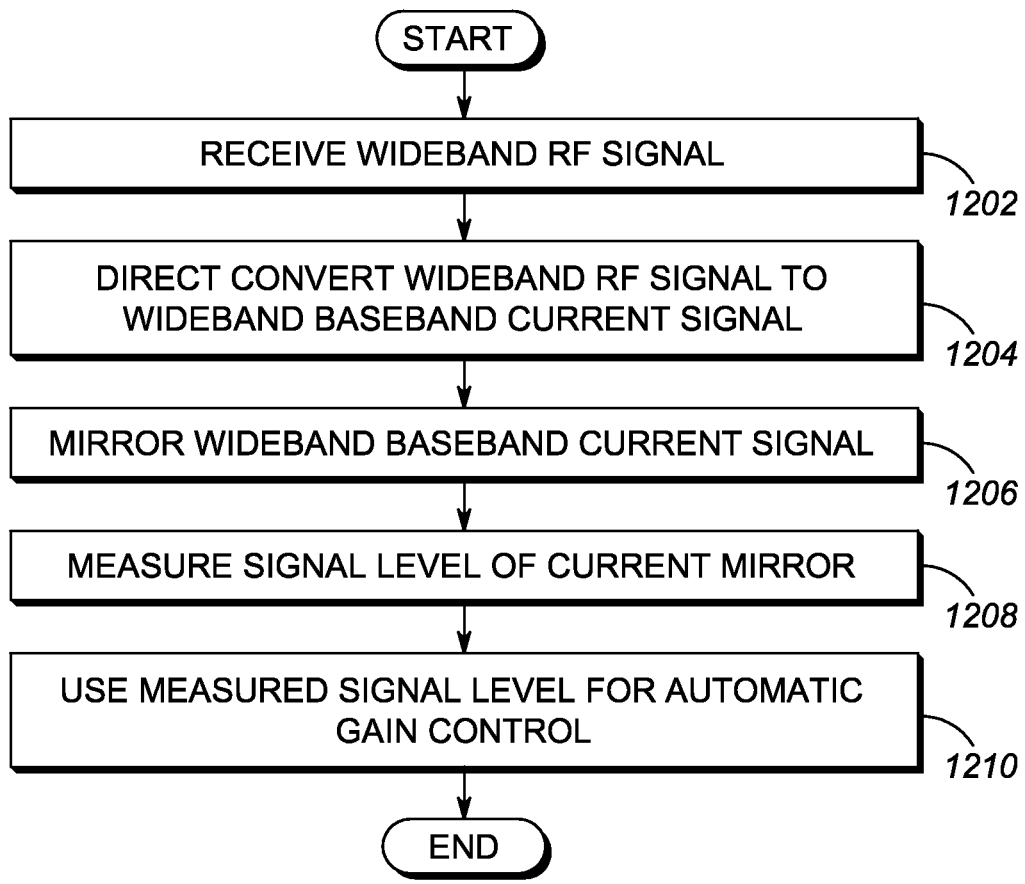
FIG. 12 depicts a method in accordance with at least one embodiment.

FIG. 12 depicts a method 1200 that could be carried out by a system such as system 100 or system 200 described above. The method 1200 begins at 1202, where receiver 102, which has an adjustable gain, receives wideband RF signal 110 while tuned to a channel of interest. At 1204, receiver 102 converts wideband RF signal 110 to wideband baseband current signal 210. At 1206, current replicator 104, which is coupled to receiver 102, generates a mirrored current 116 of the wideband baseband current signal 210. At 1208, wideband signal-level detector receives the mirrored current 116 from the current replicator 104, measures a signal-level value of the mirrored current 116, and outputs the measured signal-level value 118. At 1210, the AGC 108 receives the signal-level value 118 from the wideband signal-level detector 106, and adjusts the gain of the receiver 102 based at least in part on the received signal-level value 118.

In at least one embodiment, receiver 102 is a current-mode RF receiver. In at least one such embodiment, receiver 102 is a direct-conversion current-mode RF receiver. In at least one embodiment, receiver 102 is a voltage-mode RF receiver. In general, the present systems and methods can be applied to a receiver that utilizes any kind of operational amplifier for which the output current can be mirrored as described herein.

In at least one embodiment, the wideband baseband current signal 210 (and thus also the mirrored current 116) includes information about a part of the received wideband RF signal 110 that is up to 500 MHz away from the channel of interest. In at least one embodiment, the receiver 102 includes PMA 206 that has an output stage 306 at which the wideband baseband current signal 210 (in the form of feedback current 312) is present; in some such embodiments, the current replicator 104 is coupled to the receiver 102 at the PMA output stage 306.

In at least one embodiment, the receiver 102 includes LNA 202, which has an adjustable gain; in such embodiments, step 1210 involves adjusting the gain of the LNA 202. In at least one embodiment, adjusting the gain of the receiver 102 based at least in part on the received signal-level value 118 involves decreasing the gain of the receiver 102 when the received signal-level value 118 is greater than a threshold. In at least one such embodiment, that threshold is an upper threshold, and adjusting the gain of the receiver 102 based at least in part on the received signal-level value 118 involves increasing the gain of the receiver 102 when the received signal-level value 118 is less than a lower threshold (that is less than the upper threshold). And certainly many other possible implementations exist as well, as FIG. 12 and the other figures and examples provided and described herein are provided by way of example and not limitation.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A system comprising:
    a current-mode direct-conversion radio frequency (RF) receiver having an adjustable gain, the current mode direct conversion receiver configured to receive a wideband RF signal while tuned to a channel of interest and further configured to convert the received wideband RF signal to a wideband baseband current signal, wherein the wideband baseband current signal includes all spectral information present in the wideband RF signal;
    a current replicator coupled to the current mode direct conversion receiver and configured to generate a mirrored current of the wideband baseband current signal, wherein the spectral information present in the wideband baseband current is present in the mirrored current;
    a wideband signal-level detector configured to receive the mirrored current from the current replicator and further configured to measure and output a signal-level value of the mirrored current; and
    an automatic gain-control circuit (AGC) configured to receive the signal-level value from the wideband signal-level detector and further configured to adjust the gain of the receiver based at least in part on the received signal-level value.

2. The system of claim 1, wherein the RF receiver is a voltage-mode RF receiver.

3. The system of claim 1, wherein the wideband baseband current signal includes information about a part of the received wideband RF signal that is up to 500 MHz away from the channel of interest.

4. The system of claim 1, wherein the current-mode direct-conversion receiver comprises a post-mixer amplifier (PMA) having an output stage at which the wideband baseband current signal is present, wherein the current replicator is coupled to the current-mode direct-conversion receiver at the PMA output stage.

5. The system of claim 1, wherein the current-mode direct-conversion receiver comprises a low-noise amplifier (LNA) having an adjustable gain, wherein the AGC is configured to adjust the gain of the receiver at least in part by adjusting the gain of the LNA.

6. The system of claim 1, wherein the wideband signal-level detector comprises a current rectifier, a current-to-voltage converter, and a comparator.

7. The system of claim 1, wherein the signal-level value comprises a Boolean flag value.

8. The system of claim 1, wherein the signal-level value comprises a measured magnitude of the received mirrored current.

9. The system of claim 1, wherein the AGC is configured to decrease the gain of the current-mode direct-conversion receiver when the received signal-level value is greater than a threshold.

10. The system of claim 9, wherein the threshold is an upper threshold, wherein the AGC is configured to increase the gain of the current-mode direct-conversion receiver when the received signal-level value is less than a lower threshold, the lower threshold being less than or equal to the upper threshold.

11. The system of claim 10, wherein the lower threshold is less than the upper threshold.

12. The system of claim 10, wherein the lower threshold is equal to the upper threshold.

13. The system of claim 1, wherein the AGC is configured to increase the gain of the current-mode direct-conversion receiver when the received signal-level value is less than a threshold.

14. A method comprising:
    a current-mode direct-conversion radio frequency (RF) receiver receiving a wideband RF signal while tuned to a channel of interest, the current-mode direct-conversion receiver having an adjustable gain;

the current-mode direct-conversion receiver converting the received wideband RF signal to a wideband baseband current signal, wherein the wideband baseband current signal includes all spectral information present in the wideband RF signal;

a current replicator generating a mirrored current of the wideband baseband current signal, the current replicator being coupled to the receiver, wherein the spectral information present in the wideband baseband current is present in the mirrored current;

a wideband signal-level detector receiving the mirrored current from the current replicator, measuring a signal-level value of the mirrored current, and outputting the measured signal-level value; and an automatic gain-control circuit (AGC) receiving the signal-level value from the wideband signal-level detector, and adjusting the gain of the current-mode direct-conversion receiver based at least in part on the received signal-level value.

15. The method of claim 14, wherein the wideband baseband current signal includes information about a part of the received wideband RF signal that is up to 500 MHz away from the channel of interest.

16. The method of claim 14, wherein adjusting the gain of the current-mode direct-conversion receiver based at least in part on the received signal-level value comprises decreasing the gain of the receiver when the received signal-level value is greater than a threshold.

17. A system for adjusting a gain of a current-mode direct-conversion radio frequency (RF) receiver configured to receive a wideband RF signal while tuned to a channel of interest, the system comprising:

a low-noise amplifier (LNA) having an adjustable gain, the LNA configured to amplify the received wideband RF signal;

a mixer coupled to the LNA, the mixer configured to convert the amplified wideband RF signal to a wideband baseband current signal;

a post-mixer amplifier (PMA) coupled to the mixer, the PMA configured to generate a narrowband output signal containing the channel of interest, the PMA having an output stage at which the wideband baseband current signal is present, wherein the wideband baseband current signal includes all spectral information present in the wideband RF signal;

a low pass filter coupled at the output of the PMA, thereby enabling the PMA to operate as a trans-impedance amplifier (TIA) that converts and amplifies the wideband baseband current signal into an output voltage signal;

a current replicator coupled to the output stage of the PMA, the current replicator configured to generate a mirrored current of the wideband baseband current signal, wherein the spectral information present in the wideband baseband current is present in the mirrored current;

a wideband signal-level detector coupled to the current replicator, the wideband signal-level detector configured to measure and output a signal-level value of the mirrored current; and an automatic gain-control circuit (AGC) coupled to the wideband signal-level detector, the AGC configured to adjust the gain of the LNA based at least in part on the received signal-level value.

18. The system of claim 17, wherein the wideband baseband current signal includes information about a part of the received wideband RF signal that is up to 500 MHz away from the channel of interest.

* * * * *